United States Patent
Entringer et al.

(10) Patent No.: US 7,619,863 B2
(45) Date of Patent: Nov. 17, 2009

(54) GATED THYRISTOR AND RELATED SYSTEM AND METHOD

(75) Inventors: Christophe Entringer, Grenoble (FR); Philippe Flatresse, Froges (FR); Pascal Salome, Vif (FR); Florence Azaïs, Combaillaux (FR); Pascal Nouet, Combaillaux (FR)

(73) Assignee: STMicroelectronics, SA, Montrouge (FR)

( * ) Notice: Subject to any disclaimer, the term of this patent is extended or adjusted under 35 U.S.C. 154(b) by 69 days.

(21) Appl. No.: 11/825,651

(22) Filed: Jul. 5, 2007

(65) Prior Publication Data

US 2008/0088993 A1  Apr. 17, 2008

(30) Foreign Application Priority Data

Jul. 6, 2006  (FR) .................................. 06 52837

(51) Int. Cl.
| | | |
|---|---|---|
| *H02H 9/00* | (2006.01) | |
| *H02H 3/20* | (2006.01) | |
| *H02H 9/04* | (2006.01) | |
| *H02H 3/22* | (2006.01) | |
| *H02H 1/00* | (2006.01) | |
| *H02H 1/04* | (2006.01) | |
| *H02H 9/06* | (2006.01) | |
| *H01C 7/12* | (2006.01) | |

(52) U.S. Cl. .................... 361/56; 361/91.1; 361/111; 361/118

(58) Field of Classification Search .................. None
See application file for complete search history.

(56) References Cited

U.S. PATENT DOCUMENTS

| | | | | |
|---|---|---|---|---|
| 4,888,627 | A | * 12/1989 | Pattanayak et al. | .......... 257/113 |
| 5,400,202 | A | * 3/1995 | Metz et al. | ..................... 361/56 |
| 5,682,047 | A | * 10/1997 | Consiglio et al. | ........... 257/335 |
| 6,072,677 | A | 6/2000 | Chen et al. | |
| 6,538,266 | B2 | * 3/2003 | Lee et al. | ..................... 257/173 |
| 6,642,088 | B1 | 11/2003 | Yu | |
| 2003/0141545 | A1 | 7/2003 | Okawa et al. | |
| 2004/0100746 | A1 | * 5/2004 | Chen et al. | ..................... 361/56 |

OTHER PUBLICATIONS

French No. 06/52837, Search Report; published Feb. 6, 2007.

* cited by examiner

*Primary Examiner*—Albert W Paladini
*Assistant Examiner*—Dharti Patel
(74) *Attorney, Agent, or Firm*—Kevin D. Jablonski; Graybeal Jackson LLP

(57) ABSTRACT

An embodiment of a protection circuit, comprising a first PNP-type bipolar transistor and a second NPN-type bipolar transistor, the base of the first transistor being connected to the collector of the second transistor and the collector of the first transistor being connected to the base of the second transistor, in which a MOS transistor is connected between the collector and the emitter of the second transistor.

38 Claims, 3 Drawing Sheets

_US 7,619,863 B2_

GATED THYRISTOR AND RELATED SYSTEM AND METHOD

PRIORITY CLAIM

This application claims priority from French patent application No. 06/52837, filed Jul. 6, 2006, which is incorporated herein by reference.

TECHNICAL FIELD

An embodiment of the present invention generally relates to the protection of circuits or components against abrupt voltage/current variations on their input and/or output terminals, and more specifically relates to a switch capable of pulling any abrupt variation in the voltage/current to the reference terminal of the circuit supply (the ground).

BACKGROUND

During the use of devices formed of semiconductor materials, overvoltages may appear as a consequence of electrostatic discharge (ESD) phenomena linked to the environment of the devices, especially due to a manipulation by a user.

ESD phenomena are particularly disturbing in the use of devices made in semiconductor substrates on insulators, SOI. SOI substrates are increasingly used since they enable, among other features, decreasing stray capacitances. To protect SOI devices against ESD phenomena, protection means are generally provided at the level of each input/output terminal.

Protection means are, for example, formed of a switch which turns on on occurrence of an ESD discharge on the terminal and then sends the discharge current back to the circuit ground.

The protection switch, for example, is an N-channel MOS transistor having its gate connected to the source. The triggering of the MOS transistor results from the triggering of the parasitic bipolar transistor intrinsic to the MOS transistor.

A disadvantage of such a switch lies in the fact that the substrate typically must have a relatively large thickness. This is an obstacle to the use of such switches in SOI-type processes in which the substrate thickness is limited, often insufficient for a sufficiently sensitive parasitic bipolar transistor to exist. Protection switches formed in solid substrates typically must then be used in an SOI-type process.

FIG. 1 illustrates the equivalent electric diagram of a known protection switch 1 used in thick solid substrates. "Thick substrate" is used to designate a substrate having a thickness greater than the thickness of the silicon-on-insulator layers, which are generally lower than 0.2 μm. Switch 1 comprises two bipolar transistors Q1 and Q2, thyristor-connected, as described hereafter, between two anode and cathode terminals A and K. Anode A is intended to be connected to an input/output terminal IO and cathode K is connected to a reference power supply rail, currently ground (GND). Transistor Q1 is of type PNP and transistor Q2 is of type NPN. Emitter E1 of transistor Q1 forms anode A of the protection means connected to terminal IO. Collector C1 of transistor Q1 is connected to cathode K of the switch via an access resistor R1. Base B1 of transistor Q1 is connected to terminal IO via a resistor R2. Base B1 is also connected to collector C2 of transistor Q2. Emitter E2 of transistor Q2 forms cathode K of the switch intended to be connected to ground GND. Base B2 of transistor Q2 is connected to collector C1.

FIG. 2 is a cross-section view of an embodiment of switch 1 of FIG. 1 in a semiconductor wafer, typically single-crystal silicon. Switch 1 is formed in a surface of the wafer comprising two lightly-doped neighboring regions or wells of complementary types. The N-type well is designated as 20 and the P-type well is designated as 30. Well 20 comprises two $N^+$ and $P^+$ surface regions, respectively 22 and 24 of complementary conductivity types and separated by an insulation region 26. Regions 22 and 24 are connected to a same anode metallization A. Well 30 comprises two heavily-doped $N^+$ and $P^+$ surface regions, respectively 32 and 34, of complementary types separated by an insulation region 36. Regions 32 and 34 are connected to a same cathode metallization K. The four $N^+$, $P^+$, $N^+$, and $P^+$ regions, respectively 22, 24, 32, and 34 are arranged so that two neighboring regions are of complementary conductivity types. $P^+$ region 24 of well 20 and $N^+$ region 32 of well 30 are adjacent, separated by an insulation region 40. Lateral regions 22 and 34 are bounded by a peripheral insulation region 42.

Comparing FIGS. 1 and 2, it is noted that N well 20 forms common point B1/C2 and forms resistor R2 between common point B1/C2 and anode A, and $P^+$ region 24 forms emitter E1. Similarly, P well 30 forms common point C1/B2 and forms resistor R1 interposed between point C1/B2 and cathode K, and $N^+$ region 32 forms emitter E2.

On occurrence of a discharge, a strong current pulse enters anode A of switch 1 and flows towards cathode K through $P^+$ region 24, resistor R2 (well 20), N-P junction 20-30, resistor R1 (well 30), and $N^+$ region 32. There then is a base current injection towards $N^+$ region 22 and into well 30. When the current reaches (or exceeds) the switching threshold of transistors Q1 and Q2, said transistors turn on. The current is then pulled towards ground GND by switch 1.

As illustrated by curve I(V) of FIG. 3, once a given threshold Vi across the nodes A and K (i.e., across the switch 1) is reached, the threshold Vi being set by the characteristics of PN junction 30-20, input resistors R1 and R2, and the current amplification factors of bipolar transistors Q1 and Q2, the voltage across switch 1 collapses, and is thereafter limited, to a value V1. It is noted that this limitation to V1 only occurs after a turn on of the thyristor formed of regions 24, 20, 30, and 32.

A disadvantage of a switch such as the switch 1 lies in its bulk operation. Thus, to form the different regions 22, 24, 32, and 34 bounded by insulation regions 26, 36, 40, and 42 while guaranteeing a sufficient underlying thickness of wells 20 and 30, a relatively thick substrate typically must be available.

SUMMARY

An embodiment of the present invention aims at providing a switch for protection against ESD discharges which overcomes at least some of the disadvantages of known structures.

In particular, an embodiment of the present invention provides a switch for protection against electrostatic discharges formed in a substrate on insulator (SOI).

An embodiment of the present invention provides a protection circuit, comprising a first PNP-type bipolar transistor and a second NPN-type bipolar transistor, the base of the first transistor being connected to the collector of the second transistor and the collector of the first transistor being connected to the base of the second transistor, in which a MOS transistor is connected between the collector and the emitter of the second transistor.

According to an embodiment of the present invention, the protection circuit is formed in a semiconductor substrate, and the substrate is of substrate-on-insulator type and comprises four vertical regions extending across the entire thickness of said substrate, two neighboring regions being of complementary conductivity types, two central regions being relatively lightly doped, and two lateral regions being relatively heavily doped, an insulated gate extending on the lightly-doped P-type central region and overlapping its junction with the lightly-doped N-type central region.

According to an embodiment of the present invention, the substrate is made of a material comprising silicon, the surfaces of the lateral regions being silicided, except for the surface of the lateral P-type region close to its junction with the central N-type region.

According to an embodiment of the present invention, the surface of the central region is silicided except close to its junction with the heavily-doped P-type lateral region.

BRIEF DESCRIPTION OF THE DRAWINGS

The foregoing and other features and advantages of one or more embodiments of the present invention are discussed in detail in the following non-limiting description of specific embodiments in connection with the accompanying drawings.

DETAILED DESCRIPTION

Figure 1:
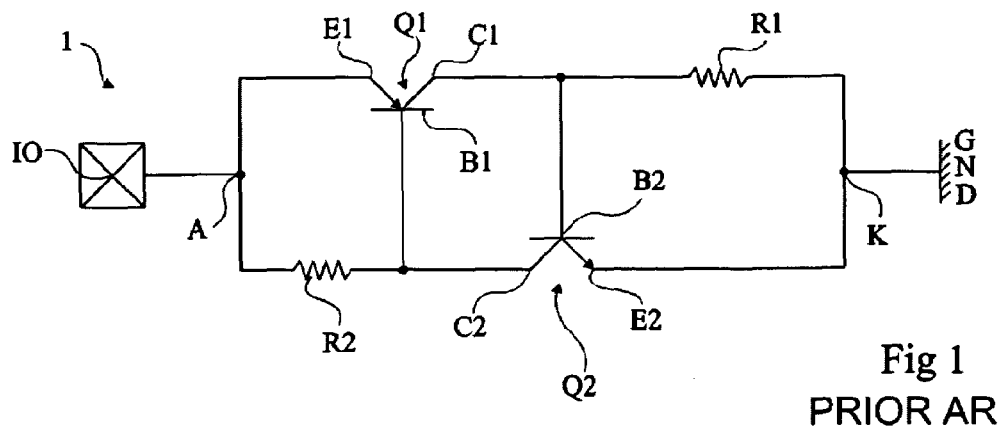
FIG. 1, previously described, is an equivalent electric diagram of a known switch of protection against electrostatic discharges.
Figure 2:
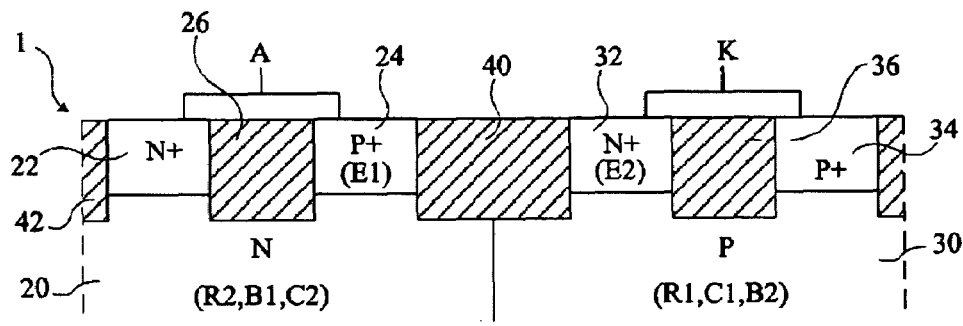
FIG. 2, previously described, is a cross-section view of an embodiment of the switch of FIG. 1.
Figure 3:
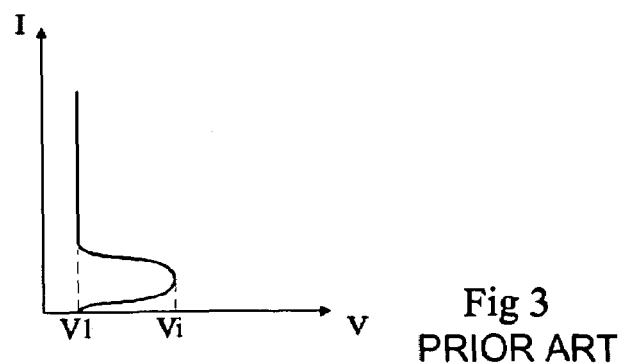
FIG. 3, previously described, illustrates the characteristic I(V) of the switch of FIGS. 1 and 2.
Figure 5:
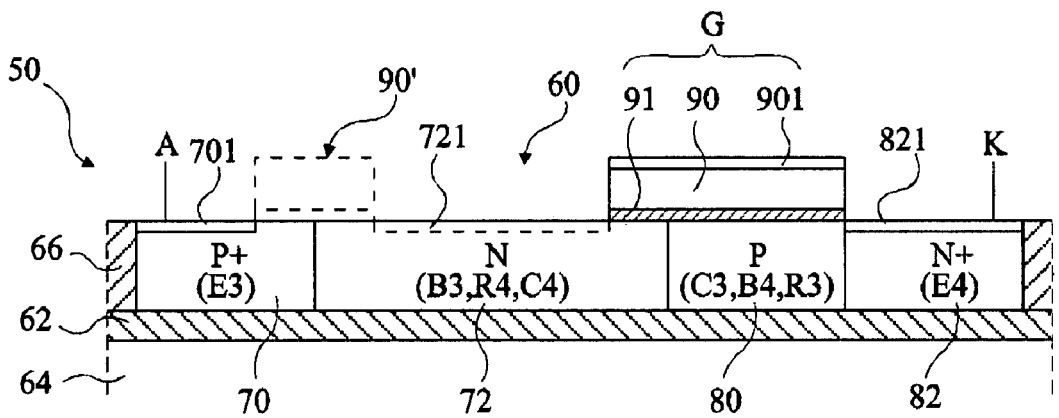
FIG. 5 is a cross-section view of the switch of FIG. 3 according to an embodiment of the present invention.
Figure 6:
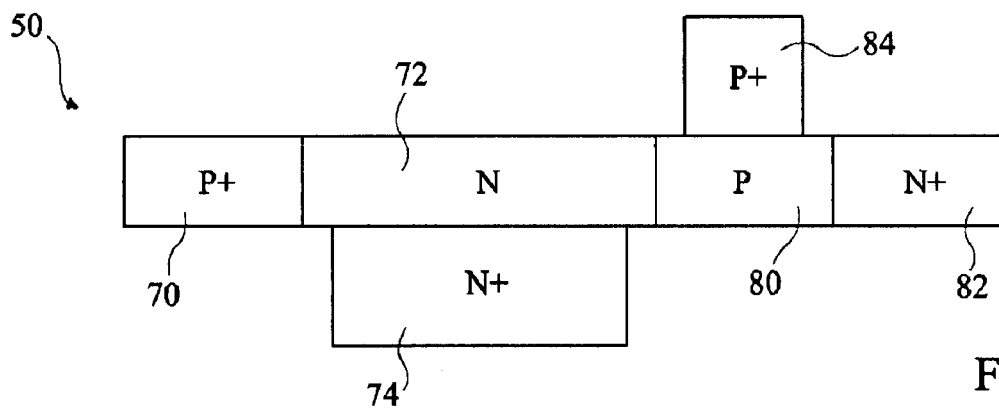
FIG. 6 is a top view of FIG. 5 according to an embodiment of the invention.
Figure 8:
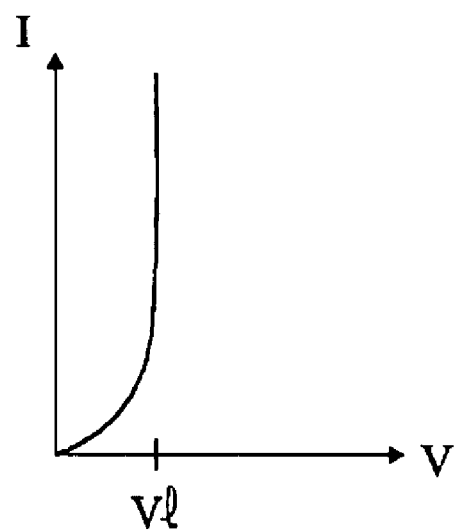
FIG. 8 illustrates the dynamic characteristic I(V) of the switch of FIGS. 4, 5, and 6 according to an embodiment of the invention.

As usual in the representation of semiconductor components, the cross-section views of FIGS. 2 and 5 and the top view of FIG. 6 as well as the curves of FIGS. 3 and 8 may not be drawn to scale. Further, elements of the same switches have been designated with same reference numerals in the different drawings.

Figure 4:
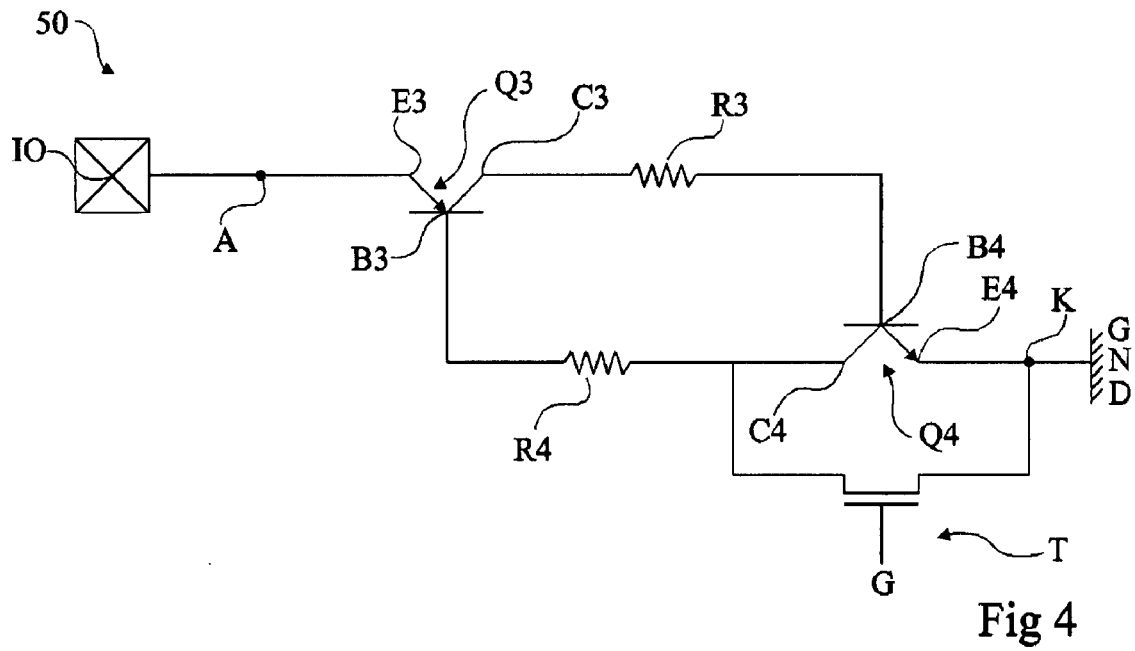
FIG. 4 illustrates an equivalent electric diagram of a switch of protection against electrostatic discharges according to an embodiment of the present invention.

FIG. 4 illustrates the equivalent electric diagram of a switch 50 according to an embodiment of the present invention.

Switch 50 comprises, between an anode A and a cathode K, two bipolar transistors Q3 and Q4 and a MOS transistor T. Anode A is intended to be connected to an input/output terminal IO of the device protected by switch 50. Cathode K is intended to be connected to a low-reference supply rail or ground GND of the device protected by switch 50. Bipolar transistor Q3 is of type PNP and bipolar transistor Q4 is of type NPN. Emitter E3 of transistor Q3 forms anode A of switch 50. Collector C3 of transistor Q3 is connected to base B4 of transistor Q4 via a resistor R3. Base B3 of transistor Q3 is connected to collector C4 of transistor Q4 via a resistor R4. Emitter E4 of transistor Q4 forms cathode K. Collector C4 is also connected to emitter E4 via MOS transistor T. N-channel transistor T pulls an electron current from base B3 of transistor Q3 into cathode K of the switch, which causes the triggering of transistor Q3. Gate G of transistor T may be left floating, but is more likely to receive a control signal.

FIG. 5 is a cross-section view of a semiconductor substrate 60 in which the switch 50 of FIG. 4 is disposed according to an embodiment of the present invention.

Substrate 60 is of substrate-on-insulator type. An insulating layer 62 insulates substrate 60 from an underlying solid substrate 64. Substrate 60 is isolated from the solid substrate 64 by an insulation area 66. Substrate 60 comprises four adjacent vertical regions 70, 72, 80, and 82 extending across the entire thickness of substrate 60, to reach insulating layer 62. The dopings of regions 70, 72, 80, and 82 are such that two neighboring regions are of complementary conductivity types P and N. The two central regions 72 and 80 are relatively lightly doped while the two lateral regions 70 and 82 are relatively heavily doped. The doping sequence of regions 70, 72, 80, and 82 thus for example is $P^+$-N-P-$N^+$. A gate 90 extends over the entire lightly-doped P-type central region 80 and is insulated from region 80 by a thin insulator 91. In an embodiment, the gate 90 overlaps the junction between N and P central regions 72 and 80 and extends beyond this junction over a portion of N central region 72. Gate 90 is insulated from underlying regions 72 and 80 by thin insulator 91. Region 70 is solid with an anode metallization A. Region 82 is solid with a cathode metallization K.

According to an embodiment of the present invention, substrate on insulator 60—and thus regions 70, 72, 80, and 82—is made of silicon or of a semiconductor material comprising silicon. Gate 90 is made of polysilicon. Apparent surfaces 701 and 821 of regions 70 and 82 and upper surface 901 of gate 90 are silicided. However, the surface of heavily-doped P-type lateral region 70 is not silicided close to its boundary with central N-type region 72.

According to an embodiment of the present invention, a specific silicidation mask is used to avoid silicidation of the junction surface between regions 70 and 72. This mask extends for example from gate G to and over region 70, which the mask partially covers. The surface of region 72 is then also non-silicided. According to a variation, the silicidation mask only covers region 72 and region 70 on either side of their junction. Surface 721 of layer 72 is then partially silicided, as illustrated in dotted lines. According to an embodiment of the present invention illustrated in dotted lines, such a local mask is obtained by forming simultaneously to gate 90 a gate 90' above the junction between $P^+$ and N regions 72 and 70.

$P^+$ region 70 of FIG. 5 forms emitter E3 of transistor Q3 (anode A of switch 50); N region 72 forms base B3, as well as resistor R4 and collector C4 of transistor Q4; P region 80 forms collector C3, as well as base B4 and resistor R3; and $N^+$ region 82 forms emitter E4 (cathode K of switch 50). Gate 90 forms gate G of transistor T.

As illustrated in FIG. 6 which is a partial top view of FIG. 5, switch 50 is completed by separate heavily-doped $N^+$ and $P^+$ regions 74 and 84, which contact respective N and P regions 72 and 80 and which extend perpendicularly to the cross-section view of FIG. 5. These regions enable access to bases B3 and B4. In FIG. 6, for simplification, neither gates 90 and 90', nor silicided surface areas 701, 721, and 821 have been shown.

The operation of switch 50 of FIGS. 4, 5, and 6 depends on the biasing of regions 72 and 80 and of gate G according to an embodiment of the invention. When gate 90' is provided, the operation may further be stabilized by a biasing of this gate 90' identical to that of gate 90.

In practice, switch 50 is blocked by the biasing of regions 72 and 80 and forced to conduct by the triggering of PNP bipolar transistor Q3 by the turning on of MOS transistor T.

The control of switch 50 is performed so that the triggering of transistor T occurs automatically when an ESD discharge occurs.

Figure 7:
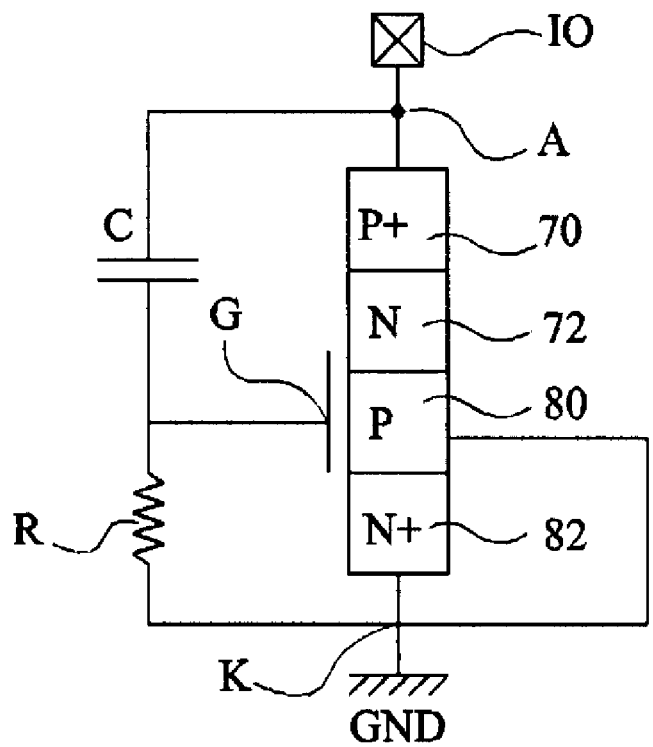
FIG. 7 illustrates a control mode of the switch of FIGS. 4, 5, and 6 according to an embodiment of the invention.

FIG. 7 illustrates an embodiment of such a control. Switch 50 is shown in simplified form by the juxtaposition of four regions 70, 72, 80, and 82, and by gate G covering P region 80 and extending over a portion of N region 72. P region 80 is connected to ground GND. Gate G is connected to the midpoint of an RC network connected between anode A and cathode K. The RC network comprises a capacitor C connected between anode A and gate G and a resistor R connected between gate G and cathode K. Resistor R is an additional resistor placed close to the input/output terminal protected by the circuit according to an embodiment of the present invention. Capacitor C is formed at least of the stray capacitance existing between anode A and gate G. It may be completed by an additional capacitor placed close to resistor R.

Cathode K is connected to ground GND of the device protected by switch 50. In steady state, gate G is biased by the RC network to a level lower than the triggering threshold of transistor T. Transistor T is then off and prevents the triggering of transistor Q3. On occurrence of a voltage pulse on anode A, a voltage pulse is transmitted by capacitor C on gate G. The RC network is sized so that, despite the direct grounding of region 80, transistor T can turn on. This is possible since the intensity of a current pulse caused by an ESD discharge is relatively high. The triggering of transistor T causes the triggering of transistor Q3, which triggers transistor Q4, and the current pulse is deviated towards cathode K connected to ground GND.

FIG. 8 illustrates characteristic I(V) of switch 50 during an electrostatic discharge of switch 50. The voltage thereacross is automatically limited to V1 by transistor T, which forces the thyristor (N-P junction 72-80) to abruptly conduct. Such a characteristic may be preferable to that illustrated in FIG. 3 of known switches.

Further, due to the possibility of blocking by an appropriate biasing of region 72 or of region 80 and of gate G, the leakage currents of switch 50 may be lower than the leakage currents observed with known protection switches. The switch 50 may thus advantageously be used in battery-supplied portable devices.

Further, as appears from the foregoing description, switch 50 is formed in an SOI substrate. It thus advantageously may be formed at the same time as a device formed in an SOI substrate that the switch is intended to protect.

Of course, the present invention is likely to have various alterations, improvements, and modifications which will readily occur to those skilled in the art. In particular, it should be noted that the RC network is a way to automatically develop a positive voltage on gate G sufficient to cause the turning-on of transistor T. Any other means may however be used.

Generally, it should be understood by those skilled in the art that the control of switch 50 may be performed in different ways. Thus, an embodiment in which switch 50 is turned off by a biasing to ground GND of P region 80 and turned on by a control of gate G of transistor T has been described. However, in another embodiment, the switch may also be blocked by connection of N region 72 to a high power supply Vdd of the device.

Further, although the present invention has been described in the context of a silicon process, it applies to any integrated circuit manufacturing process.

Furthermore, the switch 50 may be included in an integrated circuit (IC), such as a memory, which may be incorporated in a system, such as a computer system in which the IC is coupled to another IC such as a processor or a controller.

Moreover, one may use the dual of the switch 50 to discharge a current pulse where the corresponding voltage pulse across the switch is negative relative to the node k.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A protection circuit, comprising a first PNP-type bipolar transistor and a second NPN-type bipolar transistor, the base of the first transistor being connected to the collector of the second transistor and the collector of the first transistor being connected to the base of the second transistor through a resistive element, wherein a MOS transistor is connected between the collector and the emitter of the second transistor.

2. The protection circuit of claim 1, formed in a semiconductor substrate, wherein the substrate is of substrate-on-insulator type and comprises four vertical regions extending across the entire thickness of said substrate, two neighboring regions being of complementary conductivity types, two central regions being relatively lightly doped, and two lateral regions being relatively heavily doped, an insulated gate extending on the lightly-doped P-type central region and overlapping its junction with the lightly-doped N-type central region.

3. The protection circuit of claim 2, wherein the substrate is made of a material comprising silicon, the surfaces of the lateral regions being silicided, except for the surface of the lateral P-type region close to its junction with the central N-type region.

4. The switch of claim 3, wherein the surface of the central region is silicided except close to its junction with the heavily-doped P-type lateral region.

5. A circuit, comprising:
a first circuit node;
a second circuit node;
a first transistor having a first conduction node coupled to the first circuit node, a second conduction node, and a control node;
a second transistor having a first conduction node coupled to the control node of the first transistor, a second conduction node coupled to the second circuit node, and a control node coupled to the second conduction node of the first transistor;
a third transistor having first and second conduction nodes respectively coupled to the first and second conduction nodes of the second transistor, and a control node; and
a first impedance coupled between the control node of the first transistor and the first conduction node of the second transistor.

6. The circuit of claim 5 wherein:
the first transistor comprises a bipolar transistor of a first type;
the second transistor comprises a bipolar transistor of a second type; and
the third transistor comprises a field-effect transistor.

7. The circuit of claim 5 wherein:
the first transistor comprises a PNP bipolar transistor having an emitter coupled to the first circuit node, a collector, and a base;
the second transistor comprises an NPN bipolar transistor having a collector coupled to the base of the PNP transistor, an emitter coupled to the second circuit node, and a base coupled to the collector of the PNP transistor; and the third transistor comprises an N-channel insulated-gate transistor having first and second conduction nodes respectively coupled to the collector and emitter of the NPN transistor and having a gate.

8. The circuit of claim 5, comprising:
a second impedance coupled between the second conduction node of the first transistor and the control node of the second transistor.

9. The circuit of claim 5, comprising:
a first resistor coupled between the control node of the first transistor and the first conduction node of the second transistor; and
a second resistor coupled between the second conduction node of the first transistor and the control node of the second transistor.

10. The circuit of claim 5 wherein the control node of the third transistor is coupled to the first circuit node.

11. The circuit of claim 5, further comprising:
a second impedance coupled between the first circuit node and the control node of the third transistor; and
a third impedance coupled between the control node of the third transistor and the second circuit node.

12. The circuit of claim 5, further comprising:
a capacitor coupled between the first circuit node and the control node of the third transistor; and
a resistor coupled between the control node of the third transistor and the second circuit node.

13. The circuit of claim 5, further comprising:
a semiconductor substrate having
 a first region of a first conductivity type,
 a second region of a second conductivity type contiguous with the first region,
 a third region of the first conductivity type contiguous with the second region, and
 a fourth region of the second conductivity type contiguous with the third region;
wherein the first region composes the first circuit node and the first conduction node of the first transistor;
wherein the second region composes the control node of the first transistor, the first conduction node of the second transistor, and the first conduction node of the third transistor;
wherein the third region composes the second conduction node of the first transistor and the control node of the second transistor;
wherein the fourth region composes the second conduction node of the second transistor and the second conduction node of the third transistor;
an insulator disposed over the third region; and
wherein the control node of the third transistor is disposed over the insulator.

14. The circuit of claim 5, further comprising:
a semiconductor substrate having
 a P-type first region,
 an N-type second region contiguous with the first region,
 a P-type third region contiguous with the second region, and
 an N-type fourth region contiguous with the third region;
wherein the first region composes the first circuit node and an emitter of the first transistor;
wherein the second region composes a base of the first transistor, a collector the second transistor, and a first source/drain region of the third transistor;
wherein the third region composes a collector of the first transistor and a base of the second transistor;
wherein the fourth region composes an emitter of the second transistor and a second source/drain region of the third transistor;
an insulator disposed over the third region; and
wherein a gate of the third transistor is disposed over the insulator.

15. The circuit of claim 5, further comprising:
a semiconductor substrate having
 a first region of a first conductivity type,
 a second region of a second conductivity type contiguous with the first region,
 a third region of the first conductivity type contiguous with the second region,
 a fourth region of the second conductivity type contiguous with the third region,
 a fifth region of the second conductivity type contiguous with the second region, and
 a sixth region of the first conductivity type contiguous with the third region;
wherein the first region composes the first circuit node and the first conduction node of the first transistor;
wherein the second region composes the control node of the first transistor, the first conduction node of the second transistor, and the first conduction node of the third transistor;
wherein the third region composes the second conduction node of the first transistor and the control node of the second transistor;
wherein the fourth region composes the second conduction node of the second transistor and the second conduction node of the third transistor;
an insulator disposed over the third region; and
wherein the control node of the third transistor is disposed over the insulator.

16. The circuit of claim 5, further comprising:
a semiconductor first substrate having
 a first region of a first conductivity type,
 a second region of a second conductivity type contiguous with the first region,
 a third region of the first conductivity type contiguous with the second region,
 a fourth region of the second conductivity type contiguous with the third region,
 a fifth region of the second conductivity type contiguous with the second region, and
 a sixth region of the first conductivity type contiguous with the third region;
wherein the first region composes the first circuit node and the first conduction node of the first transistor;
wherein the second region composes the control node of the first transistor, the first conduction node of the second transistor, and the first conduction node of the third transistor;
wherein the third region composes the second conduction node of the first transistor and the control node of the second transistor;
wherein the fourth region composes the second conduction node of the second transistor and the second conduction node of the third transistor;
a first insulator disposed over the third region;
wherein the control node of the third transistor is disposed over the insulator;
a second substrate; and
a second insulator disposed between the first and second substrates.

17. A semiconductor structure, comprising:
a first semiconductor region having a first conductivity type;
a second semiconductor region of a second conductivity type and contiguous with the first semiconductor region;
a third semiconductor region of the first conductivity type and contiguous with the second semiconductor region;
a fourth semiconductor region of the second conductivity type and contiguous with the third semiconductor region;
a first gate insulator disposed over the second region and the third region and laterally spaced from the fourth region; and
a fifth semiconductor region disposed over the first insulator.

18. The semiconductor structure of claim 17 wherein:
the first conductivity type comprises P-type; and
the second conductivity type comprises N-type.

19. The semiconductor structure of claim 17 wherein:
the first region is more heavily doped than the third region; and
the fourth region is more heavily doped than the second region.

20. The semiconductor structure of claim 17, further comprising:
a sixth semiconductor region of the second conductivity type contiguous with the second region; and
a seventh semiconductor region of the first conductivity type contiguous with the third region.

21. The semiconductor structure of claim 17, further comprising:
a semiconductor substrate; and
wherein the first, second, third, and fourth regions are disposed in the substrate.

22. The semiconductor structure of claim 17, further comprising:
a first semiconductor substrate;
a second semiconductor substrate;
a second insulator disposed between the first and second substrates; and
wherein the first, second, third, and fourth regions are disposed in the substrate.

23. An integrated circuit, comprising:
a first circuit node;
a second circuit node;
a first transistor having a first conduction node coupled to the first circuit node, a second conduction node, and a control node;
a second transistor having a first conduction node coupled to the base of the first transistor, a second conduction node coupled to the second circuit node, and a control node coupled to the second conduction node of the first transistor;
a third transistor having first and second conduction nodes respectively coupled to the first and second conduction nodes of the second transistor, and a control node; and
a first impedance coupled between the second conduction node of the first transistor and the control node of the second transistor.

24. An integrated circuit, comprising:
a semiconductor substrate including:
a first region of a first conductivity type and having a first side,
a second region of a second conductivity type and contiguous with the first region along the only the first side;
a third region of the first conductivity type and contiguous with the second region;
a fourth region of the second conductivity type and contiguous with the third region;
a first insulator disposed over the second region and the third region; and
a semiconductor layer disposed over the first insulator.

25. A system, comprising:
an integrated circuit, comprising
a first circuit node,
a second circuit node,
a first transistor having a first conduction node coupled to the first circuit node, a second conduction node, and a control node,
a second transistor having a first conduction node coupled to the base of the first transistor, a second conduction node coupled to the second circuit node, and a control node coupled to the second conduction node of the first transistor,
a third transistor having first and second conduction nodes respectively coupled to the first and second conduction nodes of the second transistor, and a control node; and
a second impedance coupled between the second conduction node of the first transistor and the control node of the second transistor; and
a controller coupled to the integrated circuit.

26. A system, comprising:
an integrated circuit, comprising
a semiconductor substrate including:
a first region of a first conductivity type,
a second region of a second conductivity type and contiguous with the first region and having substantially the same depth as the first region,
a third region of the first conductivity type and contiguous with the second region,
a fourth region of the second conductivity type and contiguous with the third region,
a first insulator disposed over the second region and the third region, and
a semiconductor layer disposed over the first insulator; and
a controller coupled to the integrated circuit.

27. A method, comprising:
causing a first transistor to generate a first current through a first resistor and through a second transistor in response to a signal pulse on a first node to which are coupled a control node of the first transistor and a first conduction node of the second transistor;
conducting a second current between the first conduction node and a second conduction node of the second transistor in response to the first current;
conducting the second current through a third transistor.

28. The method of claim 27, further comprising conducting a portion of the first current though the third transistor.

29. The method of claim 27 wherein:
the first current comprises a base current;
conducting the second current comprises conducting an emitter-collector current through the second transistor in response to the base current;
and conducting the second current comprises conducting the second current from a base to an emitter of the third transistor.

30. The method of claim 27, further comprising:
wherein the first current comprises a base current;
wherein conducting the second current comprises conducting an emitter-collector current through the second transistor in response to the base current;
wherein conducting the second current comprises conducting the second current from a base to an emitter of the third transistor; and
conducting a portion of the first current from a collector to the emitter of the third transistor.

31. The method of claim 27, further comprising conducting the first current through the first and third transistors.

32. The method of claim 27, further comprising:
conducting a first portion of the first current through the first transistor for a first period of time; and
conducting a second portion of the first current through the third transistor for a second period of time.

33. The method of claim 27, further comprising:
conducting a first portion of the first current through the first transistor for a first period of time; and
conducting a second portion of the first current through the third transistor for a second period of time, the second period overlapping the first period.

34. The method of claim 27 wherein:
the first transistor comprises a field-effect transistor; and
the second and third transistors comprise respective bipolar transistors.

35. A circuit, comprising:
a first circuit node;
a second circuit node;
a first transistor having a first conduction node coupled to the first circuit node, a second conduction node, and a control node electrically isolated from the first circuit node;
a second transistor having a first conduction node coupled to the control node of the first transistor, a second conduction node coupled to the second circuit node, and a control node coupled to the second conduction node of the first transistor; and
a third transistor having first and second conduction nodes respectively coupled to the first and second conduction nodes of the second transistor, and a control node a first resistance coupled between the second conduction node of the first transistor and the control node of the second transistor.

36. A circuit, comprising:
a first circuit node;
a second circuit node;
a first transistor having a first conduction node coupled to the first circuit node, a second conduction node, and a control node;
a second transistor having a first conduction node coupled to the control node of the first transistor, a second conduction node coupled to the second circuit node, and a control node electrically isolated from the second circuit node and coupled to the second conduction node of the first transistor; and
a third transistor having first and second conduction nodes respectively coupled to the first and second conduction nodes of the second transistor, and a control node a second resistance coupled between the second conduction node of the first transistor and the control node of the second transistor.

37. A protection circuit, comprising
a first substrate and a second substrate separated by an insulating layer; and
a first PNP-type bipolar transistor and a second NPN-type bipolar transistor disposed in the first substrate, the base of the first transistor being connected to the collector of the second transistor and the collector of the first transistor being connected to the base of the second transistor through a resistive element disposed in the first substrate, wherein a MOS transistor is disposed in the first substrate and is connected between the collector and the emitter of the second transistor.

38. The protection circuit of claim 37 wherein the second substrate is thicker than the first substrate.

* * * * *

UNITED STATES PATENT AND TRADEMARK OFFICE
CERTIFICATE OF CORRECTION

PATENT NO. : 7,619,863 B2  Page 1 of 1
APPLICATION NO. : 11/825651
DATED : November 17, 2009
INVENTOR(S) : C. Entringer It is certified that error appears in the above-identified patent and that said Letters Patent is hereby corrected as shown below:

In claim 35, column 12, line 3, the text "a first resistance" should begin a new paragraph.
In claim 36, column 12, line 21, the text "a second resistance" should begin a new paragraph.

Signed and Sealed this

Sixteenth Day of November, 2010

David J. Kappos
*Director of the United States Patent and Trademark Office*